United States Patent [19]

Kurtz et al.

[11] Patent Number: 4,555,052
[45] Date of Patent: Nov. 26, 1985

[54] LEAD WIRE BOND ATTEMPT DETECTION

[75] Inventors: John A. Kurtz, Gorham; Donald E. Cousens, Saco; Mark D. Dufour, Portland, all of Me.

[73] Assignee: Fairchild Camera & Instrument Corporation, Mountain View, Calif.

[21] Appl. No.: 470,217

[22] Filed: Feb. 28, 1983

[51] Int. Cl.[4] .......................................... H01L 21/90
[52] U.S. Cl. ............................... 228/104; 219/56.21; 228/4.5
[58] Field of Search ................... 228/104, 4.5; 219/56.21, 56.22

[56] References Cited

U.S. PATENT DOCUMENTS

| | | | |
|---|---|---|---|
| 4,098,447 | 7/1978 | Edson et al. | 228/4.5 |
| 4,213,556 | 7/1980 | Persson et al. | 228/104 |
| 4,419,562 | 12/1983 | Jon et al. | 228/104 X |
| 4,441,248 | 4/1984 | Sherman et al. | 228/104 X |

Primary Examiner—Kenneth J. Ramsey
Attorney, Agent, or Firm—Kenneth Olsen; Carl L. Silverman; Daniel H. Kane, Jr.

[57] ABSTRACT

A method and circuits are described for sensing and detecting bond attempts and weld attempts during bonding and welding of lead wire. The method and circuitry are particularly applicable for detecting missed ball bonds and missed wedge bonds during bonding of lead wire between the die pad of a microcircuit chip and the lead frame on which the chip is mounted. A sensor (30) or sensing circuit (42) senses the different characteristic electrical condition of the lead wire (11) following a ball bond attempt and following a wedge bond attempt. A bond attempt indicator (45) indicates high resistance in the lead wire following a missed ball bond while weld attempt indicator (46) indicates low resistance in the lead wire (11) following a missed wedge bond. The lead wire (11) is isolated from uncontrolled contacts with ground potential while the lead wire is held in the bonding tool and bonding machine. Switching circuit (38) electrically switches and couples the lead wire to a controlled ground coupling (27), (52) during ball formation or to a ground isolating voltage source (28), (54) for delivering current to the lead wire and establishing a bond sensing and detecting mode following the ball bonding operating mode and wedge bonding operating mode of the bonding machine. The switching circuit (38) is actuated by a control signal (40) from the control signal circuitry of the bonding machine or from independent control circuitry. Time sequence circuitry may also be provided for the control signals.

17 Claims, 14 Drawing Figures

FIG II

LEAD WIRE BOND ATTEMPT DETECTION

CROSS REFERENCE TO RELATED APPLICATIONS

This disclosure is related to U.S. Pat. No. 4,390,771, issued June 28, 1983, entitled BONDING WIRE BALL FORMING METHOD AND APPARATUS; U.S. Pat. No. 4,434,347, issued Feb. 28, 1984, entitled LEAD FRAME WIRE BONDING BY PREHEATING; U.S. Pat. No. 4,476,366, issued Oct. 9, 1984, entitled CONTROLLED BONDING WIRE BALL FORMATION; and U.S. Pat. No. 4,476,365, issued Oct. 9, 1984, for COVER GAS CONTROL OF BONDING BALL FORMATION.

TECHNICAL FIELD

This invention relates to a new method and apparatus for sensing and detecting bond attempts and weld attempts during bonding and welding of lead wire. The invention is particularly applicable for detecting missed ball bonds and missed wedge bonds during bonding of lead wire between integrated circuit elements, for example, between the die pad of a microcircuit chip and the lead frame on which the chip is mounted. The invention may be implemented in both manual and automated bonding machines and by retrofitting existing bonding machines.

BACKGROUND ART

Bonding of lead wires between a microcircuit chip and the lead frame on which the chip is mounted for coupling to external circuitry is generally accomplished by "ball/wedge" bonding. As shown in FIG. 1, a ball 15 of lead wire metal is formed at the end of the lead wire or bonding wire 11 by melting and solidifying the end of the lead wire. Such ball formation is accomplished, for example, by flame torch or electrical discharge as further described in the U.S. patent applications cross-referenced above. After solidification, the metal ball 15 at the end of the wire is brought into intimate contact with the metalized die pad 14 as shown in FIG. 2. A ball bond is formed typically by thermocompression bonding, applying a specified force and temperature for a specified period of time. Metallic welding and diffusion combine to form this basic ball bond. Alternatively, ultrasonic bonding or other form of energy may be used.

The capillary tool 12 is then raised to a specified level above the ball bond and chip with the lead wire feeding through the capillary tool. The capillary tool 12 and chip or other substrate are then moved relative to each other for bonding of the lead wire at another location such as, for example, a lead frame finger 18. Such relative motion is typically accomplished in ball bonding machines by translating the lead frame strip beneath the raised capillary tool. At this new location the lead wire 11 is brought into intimate contact with the surface of lead frame finger 18 to form a so-called "wedge bond" or "weld". The wedge bond is formed by the side tip of capillary tool 12 bearing down on the lead wire 11 against the surface of lead frame finger 18 as shown in FIG. 4. The lead wire 11 is then severed above the wedge bond 17 by clamping the lead wire 11 at a clamp not shown and raising the bonding tool 12 and lead wire 11 above the wedge bond 17 as shown in FIG. 5. In this manner, a sound lead wire connection is established between the metalized substrate of a chip and the lead frame for coupling to external circuitry. Further background on ball bonding and wedge bonding of lead wires can be found in the article "Evaluating Wire Bond Quality" by Stephen W. Hinch and Donald R. Cropper in the February 1981 issue of *Semi Conductor International*, and the U.S. patent applications cross-referenced above.

During the wire bonding operation, the failure of the ball 15 to bond securely and adhere to the die pad 14 results in a missed ball bond referred to herein as a "bond attempt". During normal operation when the ball 15 on the end of the lead wire or bonding wire is pushed or compressed against the die pad in the presence of heat and ultrasonic energy, the ball 15 is flattened and good bonding or adhesion is obtained between the ball 15 and die pad 14 as shown in FIG. 3. When the capillary tool 12 is raised by the bonding machine the bonding wire 11 is pulled or drawn through the capillary tool 12 by the good adhesion between ball 15 and die pad 14. On the other hand, if only poor adhesion or insufficient bonding is obtained between the ball 15 and die pad 14, the flattened ball is lifted off the chip when the capillary tool 12 is raised. Thus, even though the lead wire 11 is free to feed through the tool 12, frictional forces and forces affected by withdrawal of the tool 12 are usually sufficient to lift off the flattened ball 15A in the event of poor bonding as shown in FIG. 6. In any event, the lateral movement of the lead frame strip relative to capillary tool 12 will remove a poorly bonded ball from the die pad 14. The failure of a ball 15 to adhere to the die pad 14 is referred to herein as "missed bond" or a "bond attempt". In each instance of a bond attempt, the flattened ball 15A is parted from the die pad 14 upon raising of the capillary tool or translation of the lead frame strip and bonding tool relative to each other. Such occurrence of a bond attempt necessitates corrective action at the ball bonding machine. For example, the operator of the manual type ball bonding machines, such as the High Speed Tailless Thermocompression Ball Bonder, Model 478, of Kulick & Soffa Industries, Inc., must move the capillary tool and "weld off" the flattened ball 15A at a non-interfering or out of the way location on the lead frame strip such as the paddle support. Thus, the missed ball bond is wedge bonded or welded to the paddle support and the lead wire is severed by raising of the tool and lead wire for formation of a new ball bond. The new ball is then rebonded to the die pad and the bonding operation is resumed.

The occurrence of bond attempts or missed ball bonds becomes even more critical for the new automated ball bonding machines and robots such as the Kulick & Soffa Industries, Inc., Model No. 1419, Hi Speed Ball Bonder. With many lead wire bonds and welds formed per minute, a missed ball bond must be detected immediately if any corrective action is to be taken.

Similarly, a wedge bond or weld may fail to adhere to the lead frame finger 18. Under normal operating conditions, metallic welding and diffusion combine to form a sound wedge bond with adhesion to the lead frame finger as shown in FIG. 5. In the event of insufficient bonding and poor adhesion, however, the wedge bond will part from the lead frame finger when the capillary tool 12 and lead wire 11 are raised from the surface of the lead frame finger as shown in FIG. 7. Such failure of the wedge bond to adhere to the lead frame finger surface is referred to herein as "missed wedge bond", "weld attempt" or "wedge bond attempt". After a weld attempt the lead wire passing through capillary tool 12 remains connected with the ball bond at the die pad 14 of chip 16 though weakened in the location 19 of the weld attempt. Such a wedge bond attempt or weld attempt may necessitate rejection of the microcircuit chip and it is advantageous to detect such an attempt upon occurrence for marking the corresponding microcircuit chip. In the event of such a wedge bond attempt or weld attempt, the lead wire is severed at the weakened location 19 of the wedge bond attempt by further relative motion of the lead frame strip and bonding tool relative to each other. During such corrective action, the lead wire 11 remains clamped for movement with the bonding tool 12 by a clamp not shown but part of the equipment of the standard ball bonding machine. Immediate detection of weld attempts or wedge bond attempts is further important in order to inhibit the ball bonding machine from proceeding to the ball formation operating mode before the lead wire is severed at the weakened location of the missed wedge bond.

Conventional ball bonding machines, whether partially manual or automated, generally include a number of operating modes. During the ball formation operating mode or "flame off", a ball is formed at the end of the lead wire by, for example, electrical discharge between a high voltage source and the lead wire. During such ball formation operating mode the lead wire must be grounded. Upon completion of the ball formation or ball formation operating mode, the bonding machine implements a ball bonding operating mode during which the ball is bonded to a die pad of an integrated circuit chip. Following the ball bonding operating mode the bonding machine implements a wedge bonding operating mode for bonding or welding the other end of the lead wire to the lead frame finger. Upon severing of the lead wire, the bonding machine is ready to return to the ball formation operating mode. The progress of the bonding operation from one operating mode to the next is, of course, dependent upon the formation of good quality bonds with strong adhesion. In the event of bond attempts and weld attempts, it is advantageous, of course, to implement corrective action before the bonding machine progresses to the next operating mode.

OBJECTS OF THE INVENTION

It is therefore an object of the present invention to provide a new method and apparatus for sensing and detecting bond attempts and weld attempts during bonding and welding of lead wire respectively to a microcircuit chip and to the lead frame on which the chip is mounted. The invention is applicable for both manual and automated ball bonding machines and for retrofitting existing bonding machines.

Another object of the invention is to provide an electrical method for sensing and detecting ball bond attempts and wedge bond attempts according to the electrical condition of the lead wire associated with a missed ball bond and a missed wedge bond respectively.

A further object of the invention is to provide a method for sensing and detecting ball bond attempts and wedge bond attempts immediately after occurrence so that corrective action may be taken by the operator of a manual type bonding machine or by automated steps in the robot type bonding machine.

Yet, another object of the invention is to provide new detector circuitry for sensing and detecting the electrical condition of a lead wire subject to bonding and welding between microcircuit elements.

DISCLOSURE OF THE INVENTION

In order to accomplish these results, the present invention provides apparatus and circuitry for sensing the different characteristic electrical condition of the lead wire following a ball bond attempt and following a wedge bond attempt. According to the invention, the high resistance in the lead wire following a ball bond attempt is utilized for indicating a missed ball bond. Conversely, the low resistance in the lead wire following a wedge bond attempt is used to indicate a missed wedge bond.

According to the method for utilizing the electrical condition of the lead wire in order to detect bond attempts and weld attempts, the present invention contemplates isolating the lead wire from uncontrolled contacts with ground potential while the lead wire is held in the bonding tool and bonding machine. Typically, the bonding tool, middle ground plate, and spool for the bonding wire are isolated from the bonding machine chassis and other common ground.

A first circuit is provided which includes a controlled ground coupling, a ground isolated voltage source for delivering a current, and a switch for electrically switching and coupling the lead wire held in the bonding tool to the controlled ground coupling on the one hand or to the ground isolated voltage source on the other hand. This first circuit is operatively coupled with control signal circuitry for actuating the switch and electrically coupling the lead wire to the ground coupling during the ball formation operating mode of the bonding machine. Thus, during ball formation, generally by electrically discharge, also referred in the art as "flame off", the lead wire is connected to the controlled ground connection in order to complete the ball forming electrical discharge. On the other hand, the control signal circuitry couples the lead wire to the ground isolated voltage source for delivering current to the lead wire. Coupling of the lead wire to the ground isolated voltage source establishes a bond sensing and detecting mode after the ball bonding operating mode and the wedge bonding operating mode of the bonding machine.

The invention further provides a second circuit arrangement for sensing the electrical condition of the lead wire by sensing voltage or current in the lead wire when the lead wire is electrically coupled to the ground isolated voltage source. This current sensing arrangement is responsive to current in the lead wire for detecting the effective resistance of the lead wire during the bond sensing and detecting mode. Finally, indicator circuitry is provided for indicating the detection of high resistance following a ball bonding operation thereby indicating a missed ball bond. Conversely, the indicator circuitry indicates detection of low resistance in the lead wire following a wedge bonding operation thereby indicating a missed wedge bond.

According to another aspect of the invention, means for actuating the electronic switch or other switch of the first circuit arrangement comprises the control signal circuitry of the bonding machine itself utilizing the control signals which implement the sequential operating modes of the bonding machine. Alternatively, independent control circuitry may be provided, for example, using an optical detector for sensing and detecting the position of the bonding tool and generating control signals for actuating the lead wire switch.

In a preferred form of the invention, a time sequence circuit is provided operatively coupled between the control signal circuitry and the electrical lead wire switch to generate timing signals. A first timing signal provides a first signal delay after a ball bonding operation or wedge bonding operation to introduce a delay of first duration prior to initiation of the sensing and detecting mode while the bonding tool is raised by the bonding machine. The time sequence circuit also delivers a second timing signal or signal delay to control the duration of the sensing and detecting mode.

Generally the invention contemplates providing transistor electronic switches alternately conducting and non-conducting for switching the electrical coupling of the lead wire between the controlled ground coupling and the ground isolated voltage source. A shunt resistor across the inputs of an operational amplifier detect the current and hence the resistance of the lead wire. The output of the operational amplifier controls another pair of transistor electronic switches alternately conducting according to the high or low output of the operational amplifier to provide the indication of a ball bond attempt or weld attempt. Furthermore, a third circuit arrangement is provided in the form of yet another pair of electronic transistor switches for indicating whether the lead wire bond being sensed and detected is a ball bond or wedge bond. Such third circuit may be in the form of an alternating counter as the bonding machine alternates between ball bonds and wedge bonds.

Thus, according to the method and circuitry of the invention, the lead wire is coupled to ground potential during the ball forming operating mode of the bonding machine. However, following the ball bonding operation and the wedge bonding operation, the electrical coupling of the lead wire is switched to the ground isolated voltage source for delivering current to the lead wire. The sensing and detector circuit senses the current or voltage in the lead wire for detecting the effective resistance of the lead wire. Circuitry of the invention keeps track of whether the bond being sensed is a ball bond or wedge bond. Corrective action is then taken if relatively high resistance is detected following the ball bonding operating mode, while the bonding operation continues according to normal progression if relatively low resistance is detected. Conversely, following the wedge bonding operating mode, a failure is indicated upon detection of low resistance following a wedge bond attempt, inhibiting the progression to the ball formation operating mode so that corrective action may be taken. Detection of high resistance in the lead wire following a wedge bond permits normal progression to the ball formation operating mode.

Other objects, features, and advantages of the present invention will become apparent in the following specification and accompanying drawings.

BRIEF FIGURE DESCRIPTIONS

FIG. 9 is a circuit diagram implementing the method for sensing and detecting bond attempts and weld attempts using transistor electronic switches while

DESCRIPTION OF PREFERRED EXAMPLE EMBODIMENTS AND BEST MODE OF THE INVENTION

According to the invention, separation of a bonding ball from the die pad after a ball bonding operation makes it possible to detect the occurrence of a bond attempt. If the bonding ball bonds and adheres to the die pad, the resistance from the lead wire through the die pad and chip to the lead frame which is maintained at ground potential, is characteristically about 20 to 200 ohms through all die pads of TTL, ECL, FAST and CTL integrated circuit technologies. The MOS family has a characteristically higher resistance. According to the invention, the resistance between the lead wire or bonding wire and the lead frame through the die pad is measured after the capillary tool is raised following the ball bonding operation. If the resistance is significantly higher than the characteristic resistance through the chip, then a bond attempt or missed ball bound is indicated. If the resistance is relatively low, in the range of the characteristic resistance of the chip, then the ball remained bonded to the pad. In the conventional ball bonding machine, however, both the bonding wire and the lead frame and bonding machine support are connected to ground. According to the present invention, the bonding wire or lead wire is separated from ground by appropriate installation of electrically insulating supports. Specifically, the capillary tool or bonding tool must be made of a dielectric material, such as ceramic, quartz, ruby, etc. All the guides leading the bonding wire through the bonding machine, such as bushings, etc., must be made of electrically insulating material. Finally, the spool mounting the lead wire must also be isolated from ground potential by appropriate spool material and spool mounting supports. The ground plate associated with the bonding tool and lead wire must, of course, be isolated from ground by a suitable sheet or layer of insulating material as shown for example in FIG. 11 and as hereafter described.

The ball formation operating mode of the ball bonding machine requires that the bonding wire be at ground potential so a controlled ground coupling must be provided. On the other hand, for measuring the resistance in the lead wire through the ball bond or wedge bond requires that the bonding wire be isolated from ground potential.

These conditions are similarly required for detecting the occurrence of a weld attempt or missed wedge bond. In the case of a weld attempt, it is the separation of the wedge bond from the lead frame finger and failure of the lead wire to sever above the wedge bond that makes it possible to detect the weld attempt. A missed weld or wedge bond is characterized by low resistance in the lead wire in the range of the characteristic resistance of the particular chip. A successful wedge bond is followed by severance of the lead wire and, therefore, significantly higher resistance.

Figure 1:
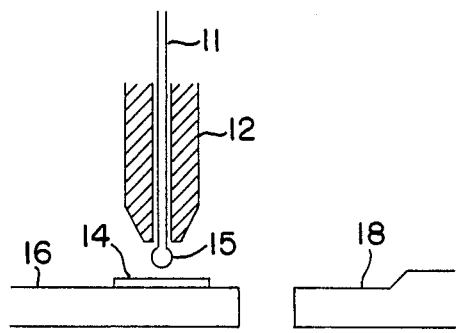
FIG. 1 is a diagrammatic side view in partial cross section of a capillary wire holding and bonding tool according to the prior art, after ball formation and prior to the ball bonding operation.
Figure 2:
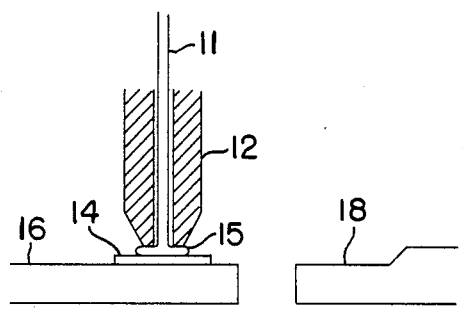
FIGS. 2 & 3 are diagrammatic side views in partial cross section of the bonding tool showing further steps during the prior art ball bonding operating mode.
Figure 3:
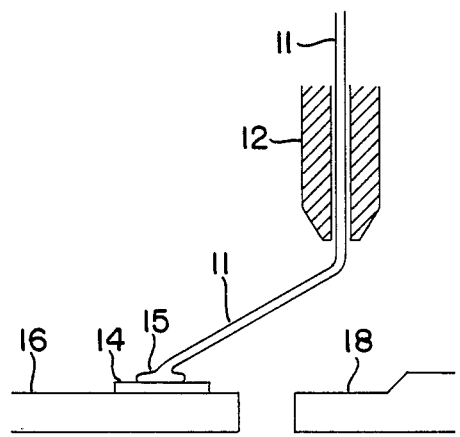
Figure 4:
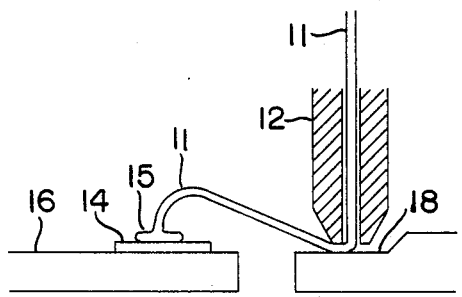
FIGS. 4 & 5 are diagrammatic side views in partial cross section of the bonding tool during the prior art wedge bonding operating mode.
Figure 5:
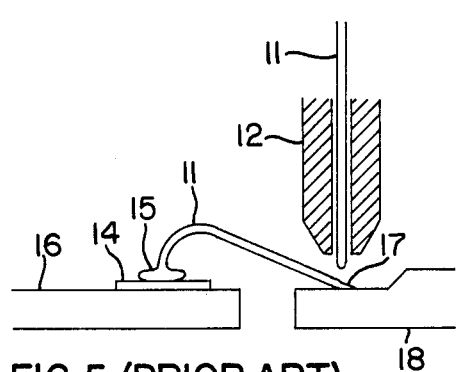
Figure 6:
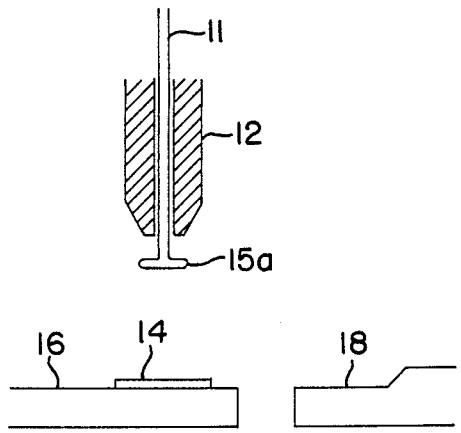
FIG. 6 is a diagrammatic side view in partial cross section of the bonding tool following a ball bond attempt or missed ball bond.
Figure 7:
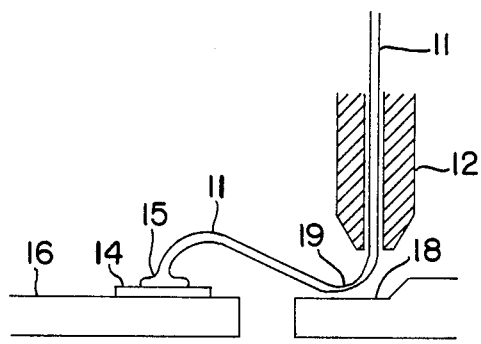
FIG. 7 is a diagrammatic side view in partial cross section of the bonding tool following a wedge bond attempt, weld attempt or missed wedge bond.
Figure 8:
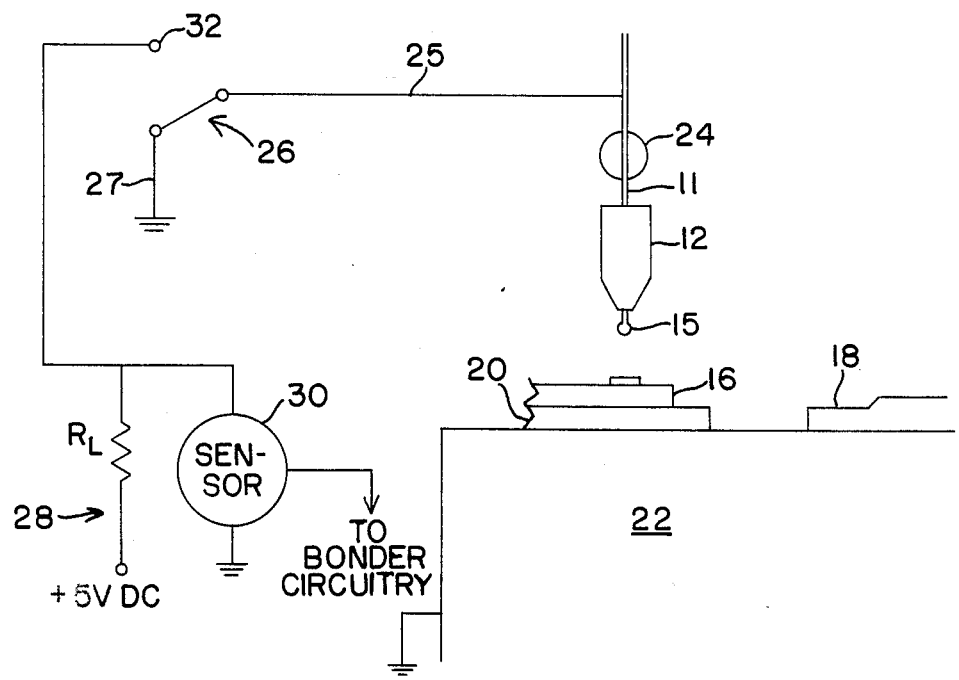
FIG. 8 is a schematic diagram of a simple circuit for implementing the method for sensing and detecting bond attempts and weld attempts according to the invention.

A simplified circuit implementing these conditions for detection of bond attempts and weld attempts according to the present invention is illustrated in FIG. 8.

As shown in FIG. 8, the chip 16 is mounted on the paddle 20 of a lead frame strip adjacent to the lead frame FIG. 18. The lead frame strip and elements rest on the heater block 22 of a conventional ball bonding machine. A capillary wire holding and bonding tool 12 is positioned and mounted by the ball bonding machine over the lead frame strip. Lead wire or bonding wire 11 feeds through the capillary tool 12 during the bonding operation but may be clamped and raised in unison with the bonding tool 12 by means of wire clamp 24. While the lead frame and heater block 22 form part of the grounded chassis of the ball bonding machine, bonding wire 11 is isolated from ground in the manner described above. That is, the capillary tool 12 is comprised of ceramic or other electrically insulating material. Similarly, the feed spool from which the wire is delivered is isolated from ground by the spool mounting support. Finally, all guide elements with which the wire comes in contact during passage and delivery through the ball bonding machine such as bushings, ground plate, etc. are all isolated from ground. Electrical contact is maintained, however, with the bonding wire 11 through line 25 connected to switch 26 which permits controlled coupling of lead wire 11 to the ground potential or ground coupling 27 on the one hand or a ground isolated regulated voltage source 28 such as a 5 volt DC-regulated source through the switch contact 32.

During the ball formation operating mode of the bonding machine, switch 26 connects lead wire 11 to ground coupling 27 to form the ball 15 in the manner, for example, described in the U.S. patent applications cross-referenced above. For the bond sensing the detecting mode, the bonding machine actuates switch 26 to connect lead wire 11 through terminal 32. In this position of the switch, lead wire 11 is isolated from ground by resistor $R_L$. The difference in voltage across resistance $R_L$, measured by means of voltage sensor 30, at the time ball bond 15 adheres to the die pad of chip 16 and the time it parts during a bond attempt may be used to actuate appropriate circuitry for corrective or compensating action. Thus, the voltage level of a bond attempt reflecting high resistance may be used to actuate a marker for example, to punch holes, apply paint, dab ink, or bend metal in or on selected parts of the lead frame strip to record selected information. Thus, identification markings can be provided meaning, for example, "this strip contains one or more bond attempts", "position 4 of this strip has a bond attempt at position 8" etc. With appropriate strip identification, such information may be stored in memory and be displayed on a CCT when the strip is placed under a suitable reader.

Figure 9:
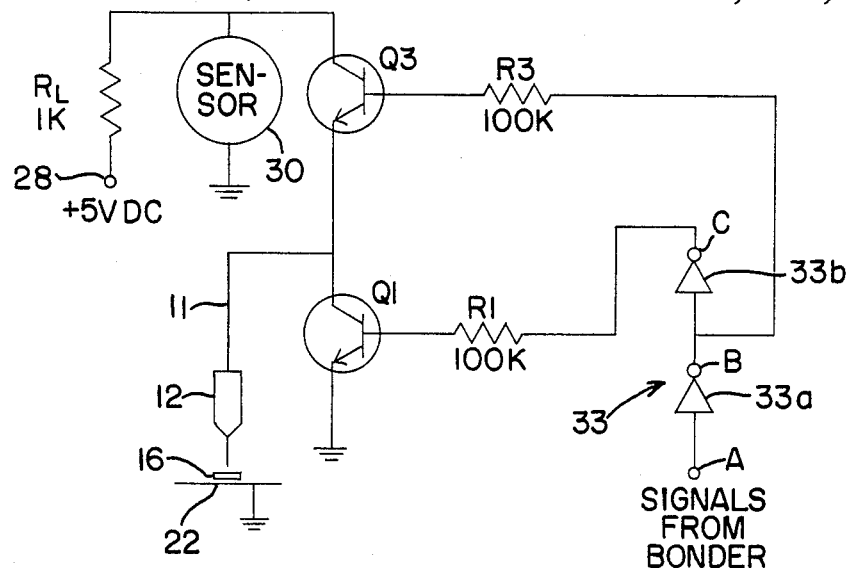
Figure 9A:
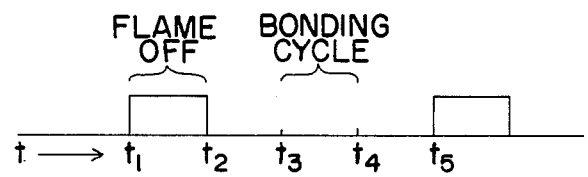
FIG. 9A is a timing diagram of the method implemented in FIG. 9.

A more detailed implementation of the circuit is illustrated in FIG. 9. In this example, an automated electronic switch is provided by two transistor switches Q1 and Q3. Control signals from the control signal circuitry of the ball bonding machine are used to implement and initiate the bond sensing and detecting circuit through terminal 32. The signals from the control circuitry of the ball bonding machine include signals initiating the sequential operating modes of the bonding machine such as the ball formation operating mode. The signals are delivered to transistor switchs Q1 and Q3 through double inverter 33 which includes inverting elements 33a and 33b. The control signal passes through both elements 33a and 33b through base resister R1 to transistor Q1 while the same control signal passes through inverter 33a only and base resister R3 to transistor Q3. Thus, transistors Q1 and Q3 receive base drive control signals of opposite polarity resulting in opposite conducting states at transistors Q1 and Q3. Referring to Tables I and II, and the timing chart of FIG. 9A, at time $t_1$ the "flame off" signal or ball formation signal arrives from the bonding machine at terminal A providing a base drive signal to transistor Q1 after passing through the double inverters 33a and 33b. Transistor switch Q1 becomes conducting coupling the bonding wire 11 to ground potential. At the same time, transistor Q3 is non-conducting therefore isolating the bonding wire 11 from the ground isolated voltage source available through terminal 28. This condition persists until time $t_2$ when the flame off signal or ball formation signal ceases and the signal level at terminal A returns from 1 to 0. The duration of this first time delay period marks the duration of the ball formation operating mode of the ball bonding machine during which the bonding ball is formed at the end of lead wire 11. At time $t_2$, transistor Q1 turns off and removes or decouples the ground potential from the bonding wire 11. At the same time as a result of a single inversion of the zero level signal to a high level one signal through inverter 33a, transistor Q3 turns on and applies a potential of 5 volts to the lead wire 11 through resistor $R_L$. Sensor 30 and additional circuitry not shown but hereafter described with reference to FIG. 11, monitors the resistance through the lead wire 11 at time $t_3$ immediately following a ball bonding operation and at time $t_4$ immediately after a wedge bonding, or weld operation. The cycle then repeats beginning with another ball formation operating mode at time $t_5$.

Times $t_3$, $t_4$, and $t_5$ are arbitrary, particularly in a manual ball bonding machine where the times are in the hands of the operator but generally are defined by pulses from sensors such as an optical sensor detecting the position of the bonding tool or from the control signal circuitry part of the bonding machine. Bond attempts and weld attempts can be respectively "looked for" or sensed when the capillary tool rises a critical distance above the bonding site. This critical range of distance is anywhere from a half a millimeter (0.020") to as high as 3 millimeters (⅛") depending upon the bonder design and operation. For good welds or wedge bonds, the measured resistance should be close to infinity after the bonding machine severs the lead wire. For weld attempts the wedge bond separates from the lead frame finger and the wire does not break. The resistance is therefore that of the wire plus the characteristic resistance of the chip and die pad. For ball bonding detection, the measurement indication is of course just the opposite. Upon detection of a bond attempt or weld attempt, the indication signal may be used to initiate a corrective subroutine or other corrective action. For example, for an automatic bonder the signal may initiate a subroutine that directs the bonding machine for welding the flattened ball of the bond attempt to the paddle support. Thereafter, the lead wire is severed and a new ball is formed at the end of the lead wire for initiating a renewed bonding operation. Thus, the bonding machine may return to the same die pad of the chip and try once again to ball bond the lead wire to the die pad.

Alternatively, the bond attempt indication signal may initiate a subroutine which stops the bonding machine, welds off the flattened ball at the paddle support, marking the particular position and lead frame for rebonding, but advancing to the next die pad of the microcircuit chip.

Further, a weld attempt indication signal may stop the bonding machine to permit the weld attempt to be examined or to mark the position and lead frame, for example, for rejection of the chip containing the missed wedge bond.

TABLE I

| POINT | TIMING $t_1$ | $t_2$ |
|---|---|---|
| A | 1 | 0 |
| B | 0 | 1 |
| C | 1 | 0 |
| $Q_1$ | ON | OFF |
| $Q_2$ | OFF | ON |

OFF = 0
ON = 1

TABLE II

| TIME | SIGNALS SIGNAL SOURCE |
|---|---|
| $t_1$ | FROM "FLAME OFF" OR BALL FORMING CIRCUIT IN BONDING MACHINE (*) |
| $t_2$ | SAME as $t_1$ |
| $t_3$ | VERTICAL MOTION OF CAPILLARY TOOL AFTER BONDING |
| $t_4$ | VERTICAL MOTION OF CAPILLARY TOOL AFTER WELDING |
| $t_5$ | SAME AS $t_1$ |

(*) IN K & S 478: PULSE FROM SLIDING SLEEVE
AUTOMATIC BONDERS e.g. K & S 1419: PULSE FROM PATTERN RECOGNITION

The timing signals $t_1$–$t_5$ may be taken from the control signal circuitry of the ball bonding machine. For example, in the case of the K & S Model 478 manual bonding machine, the time pulses are taken from the "sliding sleeve" of the bonding machine. In the case of automatic bonders such as the K & S Model 1419, the pulses are derived from the CPU or Ultrasonic generator.

Figure 10:
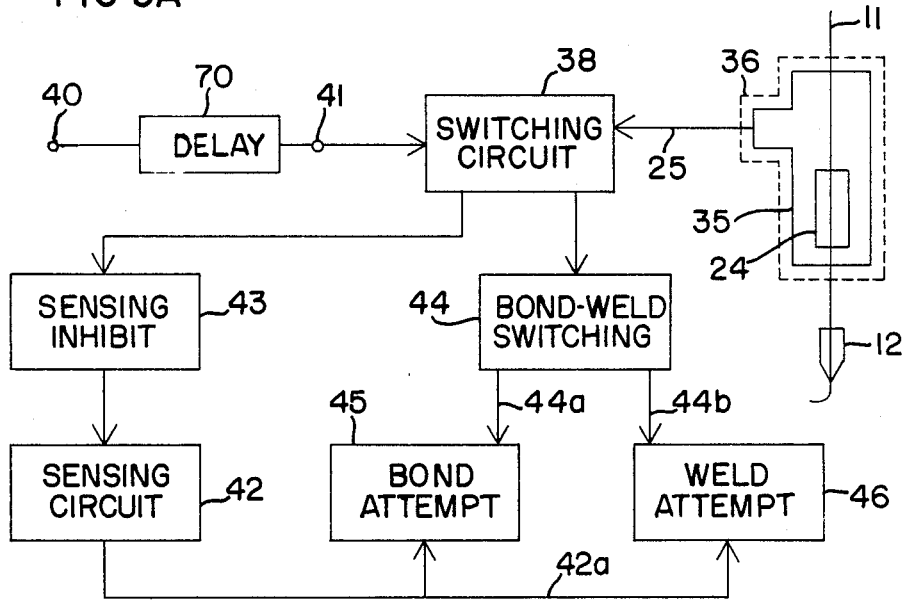
FIG. 10 is a block diagram of a fully automated system for detecting missed ball bonds and missed wedge bonds.

A generalized block diagram of a fully automated system for sensing and detecting bond attempts and weld attempts according to the invention is illustrated in FIG. 10. The lead wire or bonding wire 11 is delivered through a ceramic capillary wire holding and bonding tool as heretofore described. The elements of the lead wire supply, feed, and guide including the clamp 24 and ground plate 35 are isolated from ground by, for example, an insulating layer 36. The bond attempt/weld attempt system is formed by a first circuit including switching circuit 38 electrically coupled to the bonding wire 11 through lead 25 for electrically switching and coupling the bonding wire or lead wire 11 to ground potential during the ball formation or flame off operating mode and to a ground isolated voltage source for delivering current to lead wire 11 during the bonding cycle or after the ball bonding operating mode and the wedge bonding mode.

The switching element of switching circuit 38 is actuated by delay time sequence control signals at terminal 41 in turn derived from the control signals at terminal 40 and time sequence delay circuit 70. According to one embodiment of the invention, the control signals at terminal 40 are derived from the control signal circuitry of the ball bonding machine in which the lead wire 11 and capillary tool 12 are mounted. Thus, the conventional ball bonding machine includes a microprocessor or other control signal circuitry which generates control signals and timing signals for controlling and timing the operation of the ball bonding machine in the various operating modes such as the ball formation or flame off operating mode, ball bonding operating mode, and wedge bonding operating mode. For example, in the the K & S Model 478 ball bonding machine, pulses may be tapped from the CPU or any related control circuitry in the bonder including the ultrasonic generator or UTI Kit while in the Model 1419 automatic high speed ball bonder pulses may be tapped from the CPU.

The systems includes a second circuit including sensing circuit 42 for establishing a bond sensing and detecting mode during the bonding cycle of the ball bonding machine following the ball bonding operating mode and the wedge bonding operating mode. Thus, sensing circuit 42 operates when the switching circuit 38 is actuated to electrically couple lead wire 11 to a ground isolated voltage source for delivering current to the lead wire. As hereafter described with reference to FIG. 11, the sensing circuit 42 senses current or voltage in the lead wire 11 for determining the effective resistance of the lead wire and therefore comprises, for example, an ohmeter or a voltage sensing device. During the ball formation or flame off operating mode when the switching circuit 38 is actuated to electrically couple lead wire 11 to ground potential, the sensing circuit 42 is inhibited or nonfunctional by reason of the sensing inhibit circuit element 43.

The system further includes a third circuit for determining during the bonding cycle of the ball bonding machine whether the bond being completed is alternately a ball bond or a wedge bond. This information is critical because a bond attempt and a weld attempt are indicated by opposite electrical conditions in the lead wire 11. The information derived from sensing circuit 42 as to the effective resistance exhibited by lead wire 11 is therefore not sufficient by itself to ascertain whether or not a missed bond has occurred. The third circuit therefore provides the additional information whether or not the bond being sensed or detected by the electrical condition of lead wire 11 is a ball bond or wedge bond. The third circuit includes a bond/weld switching element which alternately delivers outputs to output lines 44a and 44b according to whether the ball bonding machine is in the ball bond operating mode or the wedge bond (weld) operating mode. Thus, the bond/weld switching element 44 alternately provides one of the two necessary inputs for the bond attempt detector and indicator 45 and the weld attempt detector and indicator 46. The other necessary input to indicators 45 and 46 is provided on the output line 42a of sensing circuit 42.

When a high resistance sensing signal appears on line 42a from the sensing circuit 42 indicating infinite or significantly high resistance in the lead wire, coincides with a signal on line 44a indicating completion of a ball bonding operation, then indicator 45 is actuated indicating the occurrence of a ball bond attempt or missed ball bond. On the other hand, if a low resistance sensing signal appears on line 42a constituting low resistance in the lead wire 11, coincides with a signal on line 44b indicating completion of a wedge bond or weld operating mode, then indicator 46 is actuated indicating the occurrence of a weld attempt or missed wedge bond.

According to alternative embodiments of the invention the control signals or pulses provided at terminal 41 for actuating the switching circuit 38 are derived from control circuitry independent of the ball bonding machine. Thus, an optical sensor or detector may be provided and retrofitted on the ball bonding machine in the vicinity of capillary tool 12. A control circuit associated with the optical sensor such as a photoelectric device provides control signals according to the sensed position of the capillary tool 12. Alternatively, a time sequence circuit of the type described hereafter with reference to FIG. 12 may be provided.

Figure 11:
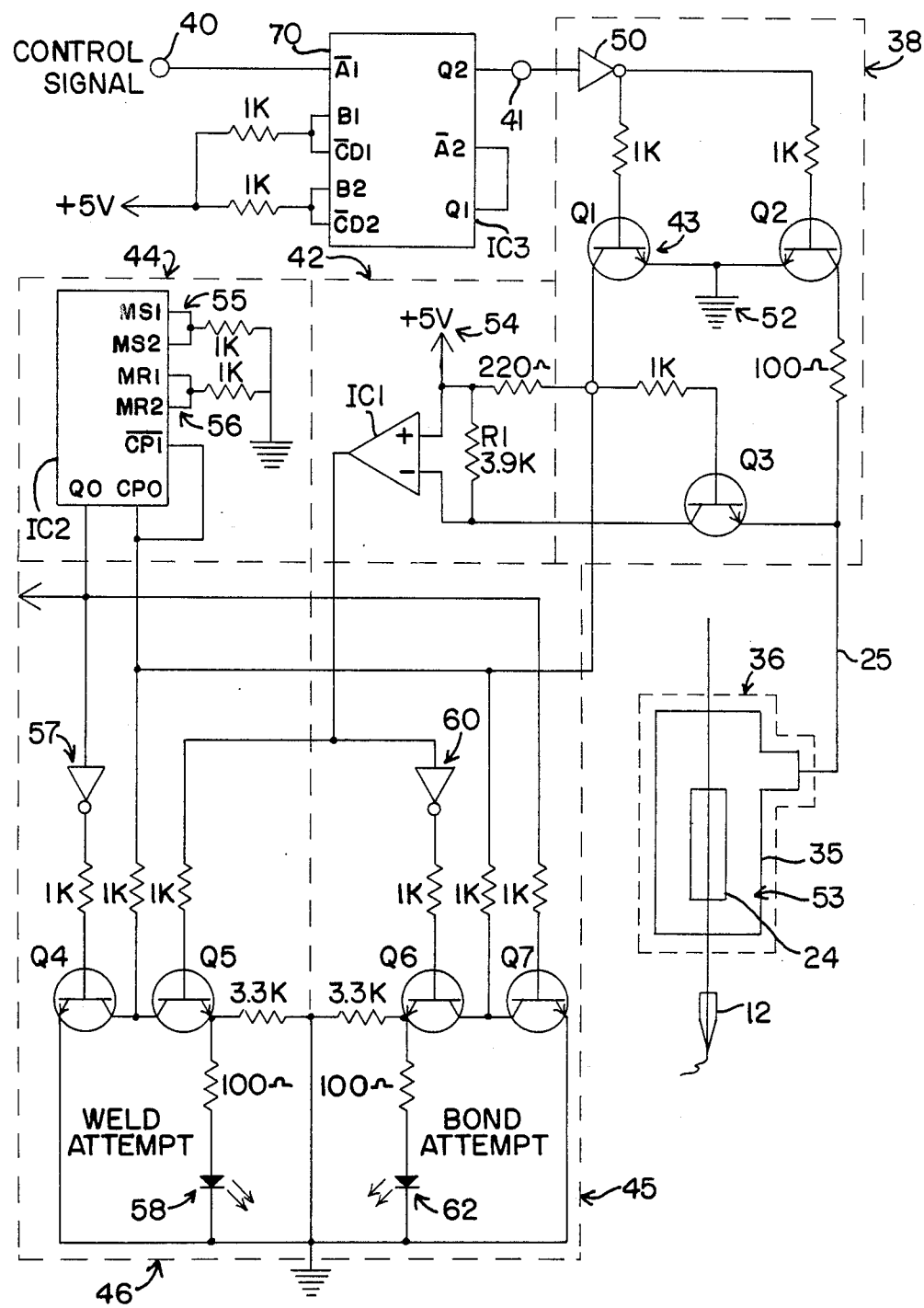
FIG. 11 is a detailed schematic diagram implementing the block diagram of FIG. 10.

The detailed schematic diagram of a circuit for implementing the system of FIG. 10 is illustrated in FIG. 11 with corresponding elements similarly numbered. The circuit of FIG. 11 includes a first circuit portion or element 38 corresponding to the switching circuit of FIG. 10 and actuated by time sequence delay control signals or pulses, appearing at terminal 41. In this example embodiment a low level signal at terminal 41 initiates the ball formation or flame off operating mode in the following manner. The low level signal at terminal 41 is inverted by inverter element 50 appearing as a high level base drive signal of inverted parallel coupled transistors Q1 and Q2. Q2 becomes conducting electrically coupling the bonding wire or lead wire 11 to ground potential by way of metal plate 35, line 25, transistor Q2 and ground terminal 52. Transistor Q1 also becomes conducting depriving transistor Q3 of base drive and turning off transistor Q3. Transistor Q3 if conducting would otherwise couple the bonding wire or lead wire 11 to the ground isolated voltage source for the sensing and detecting mode. Thus, transistor Q1 performs the function of the sensing inhibit element 43 of FIG. 10 and inhibits the sensing mode. While the low level signal appears at terminal 40, the lead wire 11 is therefore coupled to ground for forming a ball at the end of the lead wire as, for example, by electrical discharge through the lead wire.

After a ball is formed at the end of lead wire 11, the bonding machine proceeds to the ball bonding operating mode and bonds the ball at the end of the lead wire to the die pad of an integrated circuit chip. At the end of the ball bonding operation and ball bonding operating mode a high level signal appears at terminal 41, derived, for example, from the control signal circuitry of the ball bonding machine through terminal 40 and time sequence delay circuit 70. The high level signal at terminal 41 is inverted to a low level voltage signal by inverter 50 depriving transistors Q1 and Q2 of base drive. Transistors Q1 and Q2 therefore turn off. Lead wire 11 is again isolated from ground potential by nonconducting transistor Q2. With transistor Q1 nonconducting, transistor Q3 becomes conducting by reason of base drive from voltage source 54. Lead wire 11 is electrically coupled to the bond sensing and detecting circuit 42 through metal plate 35, line 25 and conducting transistor Q3. The high level signal at terminal 41 therefore initiates bond sensing and detecting mode.

The sensing circuit 42 comprises an operational amplifier IC1 having its input terminals connected in series with ground isolated voltage source 54 and lead wire 11. Shunt resistor R1 having a resistance, for example, of 3.9 K is connected across the input terminals. Operational amplifier IC1 therefore detects current passing from voltage source 54 through the lead wire in the form of a voltage difference across resistor R1. This in turn provides an inversely proportional measure of the resistance at the bonding site below bonding tool 12. Thus, for a high resistance at the bond location a smaller current passes through R1 with smaller voltage difference across the input to the terminals of IC1. Such high resistance at the bond location would be indicative of a ball bond attempt or missed ball bond on the one hand or a successful weld or wedge bond on the other hand. For a low resistance at the bond location a large current passes through the lead wire and resistor R1 providing a larger potential difference across the inputs to IC1. The low resistance at the bonding location would be indicative of a successful ball bond on the one hand or a weld attempt or missed wedge bond on the other hand.

It is thus an essential element of the circuit to keep track of the bonding mode of the bonding machine.

This is accomplished by the third circuit portion including the bond weld switching element 44 corresponding to FIG. 10 and consisting of a counter IC2. The set and reset elements 55 and 56 of counter IC2 are initially set to correspond with a ball bond operating mode and thereafter provide alternating outputs at Q0 corresponding to the alternating state of the bonding machine between the bond mode and weld mode. The third circuit portion also includes the bond attempt indicator circuit element 45 and weld attempt circuit element indicator element 46 corresponding to the same elements of FIG. 10. Operation of the first, second and third circuit portions is illustrated by way of example as follows.

With high level signal at control signal terminal 41, transistors Q1 and Q2 are nonconducting and the circuit is in the bond sensing and detecting mode. Operational amplifier IC1 senses the current in lead wire 11 effectively determining the resistance at the bond location. Assuming a successful ball bond, the low resistance at the bonding location and high current in the lead wire 11 produces a high voltage difference across the input terminals of IC1 and a high level signal at the output of IC1. Transistor Q5 of the weld attempt detector becomes conducting in preparation for indicating a weld attempt or missed wedge bond in the event the bonding machine had just completed a wedge bond or weld. However, a ball bond has just been completed and the weld attempt indicator is inhibited in the following manner. Counter IC2 delivers a low level signal at the output Q0 for indicating that the ball bonding machine is in the ball bonding operating mode and has just completed a ball bond. The low level signal is inverted by inverter 57 delivering a high level base drive current to the base of transistor Q4. Transistor Q4 therefore diverts to ground the current which would otherwise pass through transistor Q5 and illuminate the weld attempt indicator LED 58. The weld attempt indicator is therefore inhibited despite the high level signal at the output of IC1.

The effect on the bond attempt indicator 45 is as follows. The high level signal at the output of IC1 is inverted by inverting element 60 delivering a low level signal to the base of transistor Q6. Transistor Q6 becomes nonconducting thereby inhibiting the bond attempt indicator LED 62. Transistor Q7 is also nonconducting because of the low level signal delivered at the output Q0 of counter IC2. As a result, neither the bond attempt indicator 45 nor the weld attempt indicator 46 is actuated.

On the other hand, if the ball bond had failed or missed when the capillary tool 12 was raised above the bond location, the high resistance at the bond location would produce a null current and no voltage difference would appear across the inputs of operational amplifier IC1. The corresponding low level signal at the output of IC1 would be inverted by inverting element 60 delivering a high level base drive current to transistor Q6. Transistor Q6 would become conducting delivering current to actuate the bond attempt indicator LED 62. Transistor Q7 would be nonconducting and therefore would not divert the current which actuates the LED 62. Thus, the ball bond attempt would be signaled by the light emitted by LED 62.

During the wedge bonding operating mode upon completion of a wedge bond or weld a high level signal appears at the output of counter IC2. The high level signal is inverted by inverting element 57 depriving transistor Q4 of base drive current so that transistor Q4 is nonconducting. On the other hand, transistor Q7 is conducting by reason of the high level output of the counter. If the wedge bond or weld fails at the bond location, a low resistance through lead wire 11 produces a high voltage potential across the inputs of IC1 and a high level output. Transistor Q5 therefore becomes conducting deliver a current for exciting the weld attempt indicator LED 58. A weld attempt or missed wedge bond is therefore signaled by LED 58. On the other hand, the high level signal output of IC1 is inverted by inverting element 60 to a low level input at the base of transistor Q6 so that transistor Q6 is nonconducting.

A bond attempt or weld attempt indicating signal may be used for a variety of purposes. In an automatic bonder, a bond attempt signal may be used to initiate a subroutine so that the bonding machine welds the flattened ball from the bond attempt to the paddle, forms a new ball and corrects the length of the wire, and rebonds the new ball at the same location. Or a subroutine may be initiated after a bond attempt to weld off the flattened ball and mark the particular and frame by, for example, punching holes, dabbing ink or paint, bending metal, etc. for later rework. Such marking may also be used after weld attempts. With appropriate identification of the strips, the information can be put into memory and appear on a display such as a CRO when the strip is placed in a suitable reader. Or, a warning or alarm may be given or the bonding machine stopped for inspecting the missed bond or weld.

A summary of the various operating modes of the detailed circuit of FIG. 11 is summarized in Table III. Thus, the operative condition or output for integrated circuits IC1 and IC2 and transistors Q4, Q5, Q6, and Q7 are summarized in the table for each of the situations of a good ball bond, a missed ball bond, a good weld or wedge bond, and a missed weld or wedge bond. Summarizing the functions of the transistor electronic switches of the circuit of FIG. 11, transistors Q2 and Q3 form a first transistor pair which controls the electrical coupling of lead wire 11 alternately to ground potential coupling 52 or ground isolated voltage source 54. Transistors Q5 and Q6 form a second pair of transistors providing a first input for actuating the bond attempt and weld attempt indicators 62 and 58 according to the effective resistance sensed in the lead wire 11 and bond location by operational amplifier IC1. Finally, transistors Q4 and Q7 form a third transistor pair providing a second input for controlling the bond attempt indicator 62 and weld attempt indicator 58 according to whether the bonding machine is in the ball bonding operating mode or the wedge bonding operating mode as determined by the output Q0 of counter IC2. The transistors in each of the respective pairs of transistors Q2 and Q3, Q5 and Q6, and Q4 and Q7, are in opposite conducting states. The base terminals of each of the respective pairs are connected in parallel and one of the branches includes an inverting element to assure that the transistors of each pair are always in the opposite conducting state. The first circuit portion 38 includes a first pair of transistors in opposite conducting states forming a first electronic switch for switching the electrical coupling of lead wire 11 between the ground potential coupling, and ground isolated voltage source. The second circuit portion 42 for sensing the electrical condition of the lead wire and resistance at the bond location consists of the operational amplifier IC1 with shunt resistor R1 across its inputs. The third circuit portion includes a first pair of transistors Q5 and Q6 in opposite conducting states forming a first electronic switch whose output is determined by the condition sensed by the second circuit portion. The third circuit portion also includes a second pair of transistors Q4 and Q7 in opposite conducting states forming a second electronic switch whose output in determined by the counter IC2 which keeps track of the bonding mode of the ball bonding machine.

Figure 12:
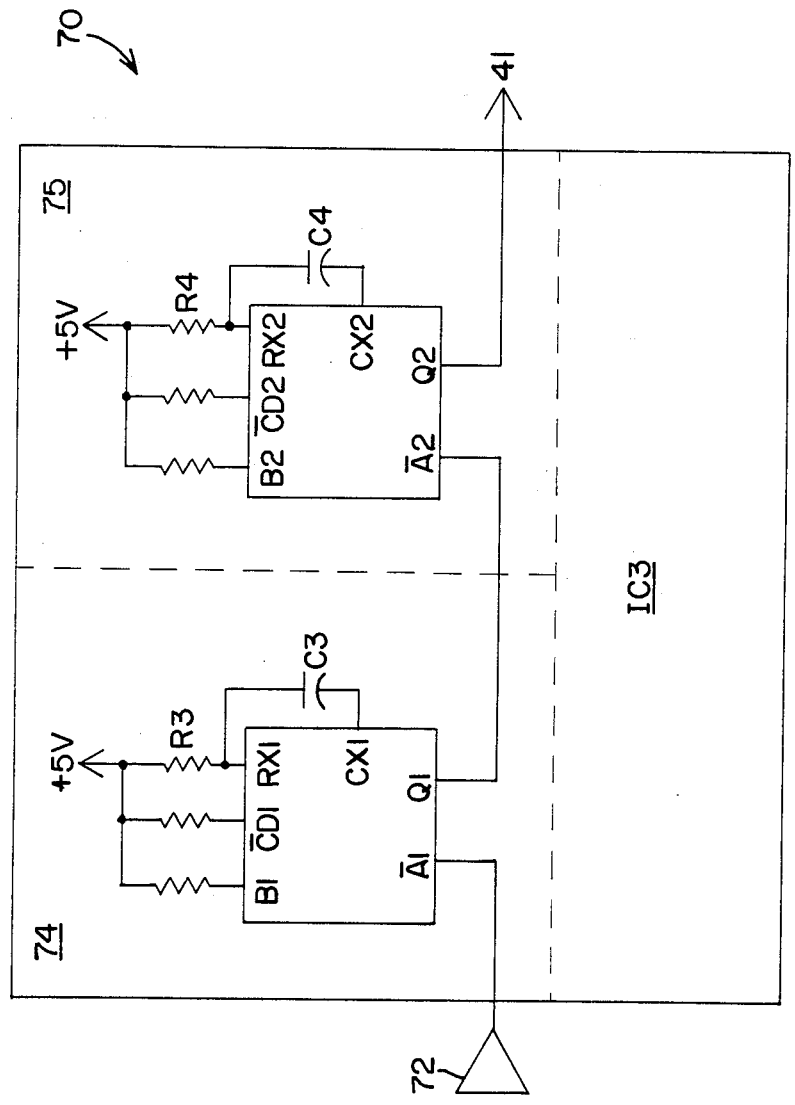
FIG. 12 is a detailed block diagram of the time sequence control circuit 70 of FIG. 11.
Figure 12A:
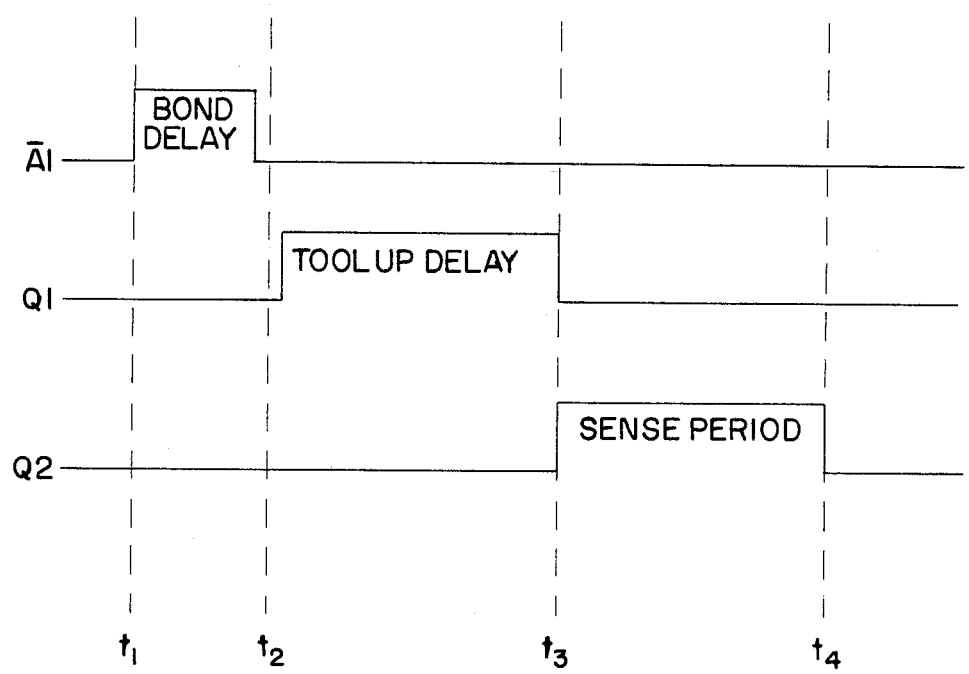
FIG. 12A is a timing chart of the time sequence control signals.

A time sequence circuit for delivering timing pulses for controlling the circuit of FIG. 11 is illustrated in FIG. 12 with the accompanying timing diagram of FIG. 12A. According to a preferred embodiment of the invention, the time sequence circuit 70 is interposed between the control signal circuitry of the ball bonding machine at terminal 40, and the input at terminal 41 to the switching circuit and bond sensing and detecting circuit of FIG. 11. Thus, the input terminal 72 of the timing sequence circuit 70 derives input control signals from the CPU or UTI kit of the ball bonding machine at terminal 40. The time sequence circuit generates square wave envelope time duration pulses at terminal 41 for controlling the bond sensing and detecting mode of the circuit of FIG. 11 with the operating modes of the ball bonding machine.

The time sequence circuit 70 includes a first one shot multivibrator 74 consisting of one-half of the an integrated circuit IC3 which may be, for example, an IC-74123. The first one shot multivibrator 74 forms a trailing edge detector and detects the trailing edge of an incoming signal A1 at terminal 72 corresponding, for example, to a ball bonding operation by the ball bonding machine and shown in FIG. 12A. Upon sensing the trailing edge indicating completion of the ball bond of the lead wire bonding ball to the die pad of an integrated circuit chip, multivibrator 74 initiates a tool-up delay signal Q1 in the form of a square wave pulse in the order of, for example, 0.015 to 0.3 seconds as shown in FIG. 12A. This first delay pulse corresponds to the time duration required by the ball bonding machine to raise the capillary wire holding and bonding tool 12 above the bond location. A conventional bonding machine such as the K & S Model 478 may require up to 0.3 seconds, for example, to raise the capillary tool. On the other hand, a high speed automated bonding machine such as the K & S Model 1419 generally requires less time to raise the capillary tool. One shot multivibrator 74 therefore introduces a first delay prior to initiation of the bond sensing and detecting mode while the bonding tool is raised above the bond location. For any particular application, the delay or time duration of the first time delay pulse is set for multivibrator 74 by the selection of resistor R3 and capacitor C3.

The first time delay pulse from multivibrator 74 is applied to the second one shot multivibrator 75 which in turn senses the trailing edge of the tool-up delay pulse. One shot multivibrator 75 consisting of one-half of the integrated circuit IC3 controls the duration of the bond sensing and detecting mode. Thus, the output of one shot multivibrator 75 shown as the signal Q2 in FIG. 12A, is applied to the terminal 41 of the circuit of FIG. 11. The time duration of the second delay pulse Q2 from multivibrator 75 is determined by the selection of the values of resistor R4 and capacitor C4. The time duration of this second pulse is selected to permit completion of the sensing and detecting of the resistance in lead wire 11 which is in turn a function of the switching speed of the integrated circuits used in the circuit of FIG. 11. The switching speed of the integrated circuits permits the sensing function to be carried out in the order of, for example, one microsecond. Thus, the time duration of the high level square wave pulse Q2 generated by the second multivibrator 75 may be selected to be in the order, for example, of as little as one to ten microseconds or less. Upon completion of the bond sensing and detecting mode according to the duration of the second pulse, the output of multivibrator 75 returns to low level applied to terminal 41 of the circuit of FIG. 11. Thus, the switching circuit and bond sensing and detecting circuit of FIG. 11 normally couples the lead wire 11 to ground potential during the major portion of the operating modes of the ball bonding machine. However, upon completion of either the ball bond or wedge bond, the high level signal from multivibrator 75 initiates a bond sensing and detecting mode actuating the circuit 11 for a short duration. It is during this time duration of the second pulse that the bond sensing and detecting operation is carried out to determine and indicate the occurrence of either a bond attempt or a weld attempt.

TABLE III

| | IC-1 | IC-2 | Q5 | Q6 | Q4 | Q7 |
|---|---|---|---|---|---|---|
| Good Bond | Hi | Lo | C | NC | C | NC |
| Missed Bond | Lo | Lo | NC | C | C | NC |
| BOND ATTEMPT LED LIGHTS UP - ONLY ROUTE TO GROUND THRU BOND ATTEMPT LED | | | | | | |
| Good Weld | Lo | Hi | NC | C | NC | C |
| Missed Weld | Hi | Hi | C | NC | NC | C |
| WELD ATTEMPT LED LIGHTS UP - ONLY ROUTE TO GROUND THRU WELD ATTEMPT LED | | | | | | |

C = Conducting
NC = Non-Conducting

While the invention has been described with respect to particular example embodiments, it is intended to cover all modifications and equivalents within the scope of the following claims.

We claim:

1. Apparatus for sensing and detecting bond attempts and weld attempts during bonding and welding of lead wire respectively to a microcircuit chip and to the lead frame on which the chip is mounted, said lead wire held during bonding and welding in the capillary wire holding and bonding tool of a bonding machine, comprising:
   means isolating the lead wire from ground potential while the lead wire is held in the bonding tool and bonding machine;
   first circuit means comprising ground coupling means, ground isolated voltage source means, and switching means for electrically switching and coupling the lead wire held in the bonding tool to the ground coupling means or to the ground isolated voltage source means:
   second circuit means comprising current sensing means for sensing the electrical condition of the lead wire when the lead wire is electrically coupled to the ground isolated voltage source means, said sensing means operatively responsive to the electrical condition of the lead wire for detecting the effective resistance in the lead wire:
   indicator means coupled to said second circuit means, for indicating the detection of high resistance in the lead wire after a bond attempt, said indicator means further operative to indicate the detection of low resistance in the lead wire after a weld attempt;
   said second circuit means comprising operational amplifier means having inputs coupled in series respectively with the lead wire and the ground isolated voltage source means, shunt resistance means connected across the inputs to said operational amplifier means for sensing current in the lead wire, and a first pair of transistor means (Q5,Q6) coupled in parallel with each other to the output of said operational amplifier means, said first pair of transistor means being in alternately opposite conducting states in response to the output of said operational amplifier means after the ball bonding operating mode and the wedge bonding operating mode respectively for controlling said indicator means according to the current level and therefore the resistance in the lead wire;
   and third circuit means for determining whether the lead wire bond being sensed and detected is a ball bond or a wedge bond and alternately controlling which of said first pair of transistor means is conducting and which is nonconducting.

2. The apparatus of claim 1 further comprising control circuit means operatively coupled to the switching means of said first circuit means for actuating said switching means and electrically coupling the lead wire either to the ground coupling means or the ground isolated voltage source means.

3. The apparatus of claim 2 wherein said control circuit means comprises control signal circuitry of the bonding machine.

4. The apparatus of claim 2 wherein said control circuit means comprises optical detector means operatively arranged relative to said bonding machine for sensing and detecting the position of the bonding tool and for generating control signals for actuating said switching means.

5. Apparatus for sensing and detecting ball bond attempts and wedge bond attempts during bonding of lead wire between a microcircuit chip and the lead frame on which the chip is mounted, said lead wire held during bonding in the capillary wire holding and bonding tool of a bonding machine, said bonding machine having a ball formation operating mode, a ball bonding operating mode, and a wedge bonding operating mode, said bonding machine further including control signal circuitry for generating control signals for controlling operation of the bonding machine in said respective operating modes and for raising the bonding tool, said apparatus comprising:

> means isolating the lead wire from ground potential while the lead wire is held in the bonding tool and bonding machine;
>
> first circuit means comprising ground coupling means, ground isolated voltage source means, and switching means for electrically switching and coupling the lead wire held in the bonding tool to the ground coupling means or to the ground isolated voltage source means;
>
> said first circuit means being operatively coupled to control signal circuitry of said bonding machine and responsive to said control signals for electrically coupling the lead wire to the ground coupling means for the ball formation operating mode of the bonding machine and for electrically coupling the lead wire to the ground isolated voltage source means for delivering current to the lead wire and establishing a bond sensing and detecting mode after the ball bonding operating mode and the wedge bonding operating mode of the bonding machine;
>
> second circuit means comprising current sensing means for sensing the electrical condition of the lead wire when the lead wire is electrically coupled to the ground isolated voltage source means by said switching means, said sensing means operatively responsive to the electrical condition of the lead wire for detecting the effective resistance of the lead wire during the bond sensing and detecting mode after the ball bonding or wedge bonding operating modes;
>
> indicator means for indicating the detection of high resistance following a ball bonding operating mode thereby indicating a missed ball bond, said indicator means further operative to indicate the detection of low resistance in the lead wire following a wedge bonding operating mode thereby indicating a missed wedge bond;
>
> time sequence circuit means operatively coupled between the control signal circuitry of the bonding machine and the switching means of the first circuit means, said time sequence circuit means responsive to control signals generated by the control signal circuitry of the bonding machine to generate timing signals for actuating said switching means for electrically switching the lead wire to the ground isolated voltage source means thereby initiating the bond sensing and detecting mode after the ball bonding operating mode and the wedge bonding operating mode, said time sequence circuit means comprising first signal delay means operatively responsive to said control signals after the ball bonding operating mode and the wedge bonding operating mode for generating a first timing signal of first duration to introduce a delay prior to initiation of the sensing and detecting mode while the bonding tool is raised by the ball bonding machine.

6. The apparatus of claim 5 wherein said time sequence circuit means further comprises second signal delay means operatively responsive to the first timing signal of the first signal delay means for generating a second timing signal of second duration to initiate the sensing and detecting mode and for controlling the time duration of said sensing and detecting mode.

7. The apparatus of claim 6 wherein said switching means is operatively responsive to said second timing signal for electrically coupling the lead wire to the ground isolated voltage source means at the beginning of the second duration and for sensing the current and detecting the resistance in said lead wire during said second duration.

8. The apparatus of claim 5 wherein said first circuit means comprises first transistor means (Q1) operatively coupling the lead wire to ground when the first transistor means is conducting, second transistor means (Q3) operatively coupling the lead wire to ground isolated voltage source means when the second transistor means is conducting, said first and second transistor means operatively coupled with the control signal circuitry of the bonding machine for responding to said control signals to be alternately conducting and nonconducting according to the operating mode of the bonding machine.

9. The apparatus of claim 5 wherein said second circuit means for sensing current in the lead wire comprises:

> operational amplifier means having inputs coupled in series with the lead wire and the ground isolated voltage source means, and further having shunt resistance means connected across the inputs to said operational amplifier means:
>
> a first pair of transistor means (Q5, Q6) coupled in parallel with each other to the output of said operational amplifier means, said first pair of transistor means being in alternately opposite conducting states in response to the output of said operational amplifier means after the ball bonding operating mode and the wedge bonding operating mode respectively for controlling said indicator means according to the current level and therefore the resistance in the lead wire;
>
> and third circuit means for determining whether the lead wire bond being sensed and detected is a ball bond or a wedge bond and alternately controlling which of said first pair of transistor means is conducting and which is nonconducting.

10. The apparatus of claim 9 wherein said first pair of transistor means comprise a first transistor (Q5) and a second transistor (Q6) having the respective base terminals thereof coupled in parallel with each other to the output of said operational amplifier, and an inverter coupled in series with the base terminal of the second transistor.

11. The apparatus of claim 9 wherein said third circuit means comprises counter means providing alternating signals at the output of said counter means during the bonding of lead wire according to whether the bonding machine is in the ball bonding operating mode or the wedge bonding operating mode, and a second pair of transistor means (Q4, Q7) coupled in parallel with each other to the output of said counter means, said second pair of transistor means being in alternately opposite conducting states in response to the output of said counter means for further controlling the operative state of said indicator means for indicating whether a bond attempt is a missed ball bond or a missed wedge bond.

12. The apparatus of claim 11 wherein said second pair of transistor means comprises a third transistor (Q4) and a fourth transistor (Q7) having the respective base, terminals coupled in parallel with each other to the output of said counter means, and second inverter means coupled in series with the base terminal of the third transistor.

13. The apparatus of claim 12 wherein said indicator means comprises wedge bond attempt indicator means and ball bond attempt indicator means:

the first (Q5) and third (Q4) transistors of the first pair and second pair of transistor means respectively coupled in inverted series configuration in a common circuit in series with the wedge bond attempt indicator, said first and third transistors having a common collector coupling:

and said second (Q6) and fourth (Q7) transistors of the first pair and second pair of transistor means respectively coupled in inverted series configuration in a common circuit in series with said ball bond attempt indicator, said second and fourth transistors having a common collector coupling.

14. Apparatus for sensing and detecting ball bond attempts and wedge bond attempts during bonding of lead wire between a microcircuit chip and the lead frame on which the chip is mounted, said lead wire held during bonding in the capillary wire holding and bonding tool of a bonding machine, said bonding machine having a ball formation operating mode, a ball bonding operating mode, and a wedge bonding operating mode, said apparatus comprising:

means isolating the lead wire from ground potential while the lead wire is held in the bonding tool and bonding machine;

first circuit means comprising ground coupling means, ground isolated voltage source means, and switching means for electrically switching and coupling the lead wire held in the bonding tool to the ground coupling means or to the ground isolated voltage source means;

control circuit means operatively coupled to the switching means of said first circuit means for actuating said switching means and electrically coupling the lead wire to the ground coupling means during the ball formation operating mode of the bonding machine and for electrically coupling the lead wire to the ground isolated voltage source means for delivering current to the lead wire and establishing a bond sensing and detecting mode after the ball bonding operating mode and the wedge bonding operating mode of the bonding machine;

second circuit means comprising sensing means for sensing the electrical condition of the lead wire when the lead wire is electrically coupled to the ground isolated voltage source means by said switching means, said current sensing means operatively responsive to the electrical condition of the lead wire for detecting the effective resistance of the lead wire during said bond sensing and detecting mode after the ball bonding or wedge bonding operating modes;

indicator means for indicating the detection of high resistance following a ball bonding operating mode thereby indicating a missed ball bond, said indicator means further operative to indicate the detection of low resistance in the lead wire following a wedge bond operating mode thereby indicating a missed wedge bond;

said second circuit means comprising operational amplifier means having inputs coupled in series respectively with the lead wire and the ground isolated voltage source means, shunt resistance means connected across the inputs to said operational amplifier means for sensing current in the lead wire, and a first pair of transistor means (Q5,Q6) coupled in parallel with each other to the output of said operational amplifier means, said first pair of transistor means being in alternately opposite conducting states in response to the output of said operational amplifier means after the ball bonding operating mode and the wedge bonding operating mode respectively for controlling said indicator means according to the current level and therefore the resistance in the lead wire;

and third circuit means for determining whether the lead wire bond being sensed and detected is a ball bond or a wedge bond and alternately controlling which of said first pair of transistor means is conducting and which is nonconducting.

15. The apparatus of claim 14 wherein said control circuit means comprises time sequence circuit means operatively coupled to the bonding machine and first circuit means for generating timing signals to actuate said switching means in timed sequence correlated with motion of the bonding tool of the ball bonding machine.

16. A method for sensing and detecting missed ball bonds during the bonding operation of bonding lead wire between a microcircuit chip and the lead frame on which the chip is mounted, said lead wire held during bonding in the capillary wire holding and bonding tool of a bonding machine comprising:

isolating the lead wire from ground potential while the lead wire is held in the bonding tool and ball bonding machine;

electrically coupling the lead wire to ground potential and forming a bonding ball at the end of the lead wire held in the bonding tool;

ball bonding the ball formed at the end of the lead wire to the die pad of an integrated circuit chip;

raising the wire holding and bonding tool above the die pad of said integrated circuit chip;

switching the electrical coupling of the lead wire from said ground potential to a ground isolated voltage source means;

sensing the current in the lead wire and detecting the effective resistance of the lead wire;

indicating detection of relatively high resistance in the lead wire thereby indicating a missed ball bond;

taking corrective action if relatively high resistance is detected and continuing the bonding operation if relatively low resistance is detected;

translating the microcircuit chip and wire holding and bonding tool relative to each other;

wedge bonding the lead wire to a lead frame finger of the lead frame on which the microcircuit chip is mounted;

raising the bonding tool above the lead frame finger to sever the lead wire above the wedge bonding site;

sensing the current in the lead wire and detecting the effective resistance of the lead wire;

and indicating detection of low resistance following wedge bonding thereby indicating a missed wedge bond.

17. The method of claim 16 wherein the step of taking corrective action comprises:

welding off the bonding ball at the end of the lead wire to the paddle of the lead frame;

raising the bonding tool and severing the lead wire;

forming a new bonding ball at the end of the lead wire;

ball bonding the new ball formed at the end of the lead wire to the die pad of said integrated circuit chip;

raising the bonding tool above said die pad;

switching the electrical coupling of the lead wire from ground potential to a ground isolated voltage source means;

and sensing the current in the lead wire and detecting the effective resistance of the lead wire.

* * * * *